United States Patent [19]
Folkes

[11] Patent Number: 6,160,274
[45] Date of Patent: Dec. 12, 2000

[54] REDUCED 1/F LOW FREQUENCY NOISE HIGH ELECTRON MOBILITY TRANSISTOR

[75] Inventor: Patrick A. Folkes, Princeton Junction, N.J.

[73] Assignee: The United States of America as represented by the Secretary of the Army, Washington, D.C.

[21] Appl. No.: 09/114,768

[22] Filed: Jul. 14, 1998

Related U.S. Application Data

[63] Continuation-in-part of application No. 08/634,496, Apr. 18, 1996, abandoned.

[51] Int. Cl.[7] ................................................. H01L 31/072
[52] U.S. Cl. ............................................ 257/191; 257/194
[58] Field of Search .................................... 257/191, 192, 257/194

[56] References Cited

U.S. PATENT DOCUMENTS

| | | | |
|---|---|---|---|
| 4,827,320 | 5/1989 | Morkoc et al. | 357/22 |
| 4,967,242 | 10/1990 | Sonoda et al. | 357/22 |
| 4,987,462 | 1/1991 | Kim et al. | 357/22 |

*Primary Examiner*—Sara Crane
*Attorney, Agent, or Firm*—Michael Zelenka; John M. O'Meara

[57] ABSTRACT

A reduced 1/f low frequency noise high electron mobility transistor is obtained based on the realization that in modulation-doped heterostructure transistors the inherent bandbending in the high bandgap material spacer layer allows certain trap energy levels to cross or approach the Fermi level at or near the 2DEG interface. For the case of AlGaAs/GaAs HEMTs or AlGaAs/InGaAs/GaAs pseudomorphic HEMTs the composition of the spacer layer is graded to provide for the conduction band energy to have a negative slope near the spacer layer/2DEG interface. This bandbending pulls interface trap energy levels away from the Fermi level and significantly reduces $f_t(1-f_t)$ and the spectral density of the 1/f low frequency noise.

10 Claims, 3 Drawing Sheets

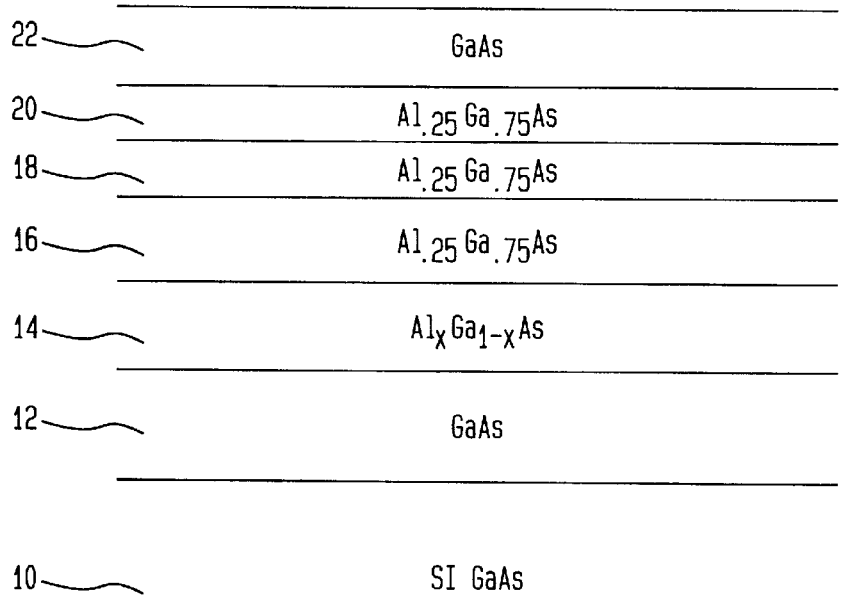
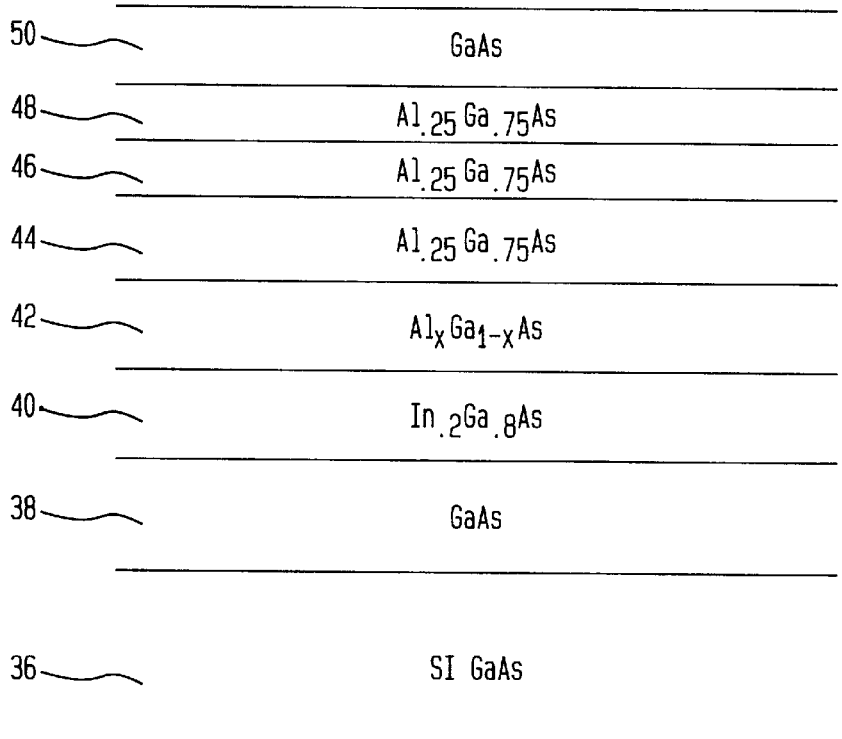

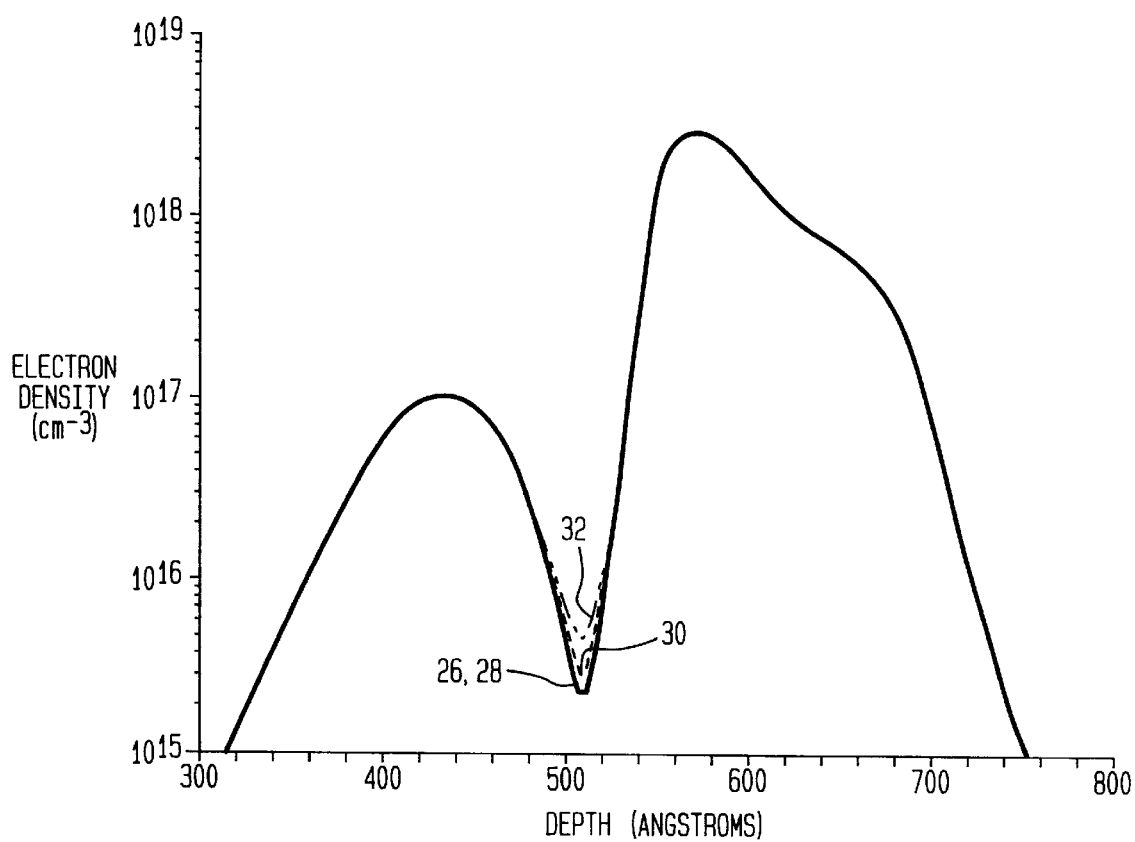

REDUCED 1/F LOW FREQUENCY NOISE HIGH ELECTRON MOBILITY TRANSISTOR

This is a Continuation-in-part (hereinafter CIP) Application relating to application Ser. No. 08/634,496, filed Apr. 18, 1996, abandoned.

GOVERNMENT INTEREST

The invention described herein may be manufactured, used, imported and licensed by or for the Government of the United States of America without the payment to me of any royalties thereon.

1. Field of the Invention

The present invention is related to transistors, and more particularly to reduced 1/f low frequency noise in high electron mobility transistors.

2. Background of the Invention

Semiconductor 1/f noise is defined as current fluctuations whose spectral density varies approximately as 1/f over a large range of frequency, f. Several theoretical models for 1/f noise in semiconductor devices have been proposed. However, despite the fact that the thermal activation energy model and electron tunneling model are often used to explain some observed 1/f noise characteristics, the basic characteristics of semiconductor 1/f noise, such as the noise amplitude and spectral range, cannot be explained self-consistently by any of these theories.

Recent observations of discrete two-level and low-frequency conductance fluctuations in small-area electronic devices have confirmed the importance of interface traps as a 1/f noise source; however the detailed physical mechanism and kinetics of charge transfer between the interface states and the bulk material is complex and not well understood. Theoretical and experimental studies of generation noise in a field effect transistor (FET) show that the dominant mechanism for this type of low-frequency noise, which is associated with a single time constant, is the fluctuating occupancy of deep-level traps in the depletion region.

However, the relationship between 1/f and generation noise was not explored and the dependence of the relaxation time on the free electron density in the depletion region was neglected in the prior art. Recent measurements of the absolute spectral density of 1/f noise in GaAs Schottky barrier FETs show that the 1/f noise consists of a surface component and a separable, uncorrelated bulk component which dominates the surface component over a wide range of applied voltages. An important discovery is the fact that the bulk 1/f noise amplitude is correlated with the low-field electron drift mobility at the depletion layer boundary and the trap density in the depletion layer. The development of a self-consistent theoretical model for 1/f and generation noise due to bulk traps in the depletion region of a semiconductor resistor has been reported in the literature.

A more comprehensive treatment of the theory including the derivation of the low-frequency noise spectral density, its dependence on the temperature and its sensitivity to Fermi-Dirac statistics of the discrete distribution of traps and a detailed comparison between experimental results is presented in an article by the inventor herein, entitled *Fluctuating deep-level trap occupancy model for 1/f noise in semiconductor resistors* appeared in the Journal of Applied Physics 68 (12), Dec. 15, 1990, pages 6279–6288.

The work on a theoretical model for 1/f noise in field-effect transistors and semiconductor resistors strongly suggests that traps in the high bandgap material at or near the high/low bandgap interface where the two dimensional electron gas (2DEG) is confined, are primarily responsible for generating 1/f and generic low frequency noise in modulation-doped heterostructure devices. Fluctuations in the resistance of the 2DEG are caused by the random capture and emission of electrons by interface traps which are located on the AlGaAs side (for the case of GaAs based high electron mobility transistors (HEMTs)).

There are obvious benefits which ensue from an ability to provide, if possible, field-effect and semiconductor transistors with reduced 1/f noise.

SUMMARY OF THE INVENTION

Accordingly, it is an object of the present invention to provide reduced 1/f low frequency noise, high electron mobility transistors.

The foregoing and other objects are realized in accordance with the present invention by providing the device described below which is based on the recognition of certain aspects of the design of such transistors. This includes the fact that the aforementioned traps have long time constants due to the reduced electron density in the AlGaAs interface depletion region.

Of fundamental importance is the fact that only traps which are energetically within 2kT of the Fermi level will generate significant 1/f or low frequency noise, since in this case the fluctuation factor $f_t(1-f_t)$, which is proportional to the spectral noise density, is relatively large. $f_t$ is the trap occupancy. In prior art modulation-doped heterostructure transistors the inherent bandbending in the high bandgap material spacer layer allows certain trap energy levels to cross or approach the Fermi level at or near the 2DEG interface. In the invention the composition of the spacer layer is graded to provide a low mole fraction side thereof and a high mole fraction side thereof, with the low mole fraction side being disposed to define one boundary of a quantum well wherein the two dimensional electron gas is confined. A decreasing; conduction band energy having a negative slope that decreases from the high mole fraction side to the low mole fraction side, near the spacer layer/ 2DEG interface. This causes bandbending which pulls interface trap energy levels away from the Fermi level, to significantly reduce $f_t(1-f_t)$ and the spectral density of the 1/f low frequency noise. It is possible to achieve this reduction in the 1/f noise spectral density without degrading the transport characteristics of the 2DEG. Although the invention is not limited thereto, the composition of the spacer layer discussed herein, is AlGaAs which for grading purposes is expressed as $Al_xGa_{1-x}As$ where the subscript x specifies the AlAs mole fraction of the AlGaAs ternary semiconductor alloy.

Other features and advantages of the present invention will become apparent from the following description of the invention which refers to the accompanying drawings.

BRIEF DESCRIPTION OF THE DRAWINGS

FIG. 1 illustrates a typical semiconductor heterostructure for one embodiment of the present invention.

FIG. 2 illustrates a typical semiconductor heterostructure for another embodiment of the present invention.

FIG. 5 is a plot of 2DEG density and spatial distribution of electron density for both the FIG. 1 and FIG. 2 embodiments.

DETAILED DESCRIPTION OF THE DRAWINGS

Figure 3:
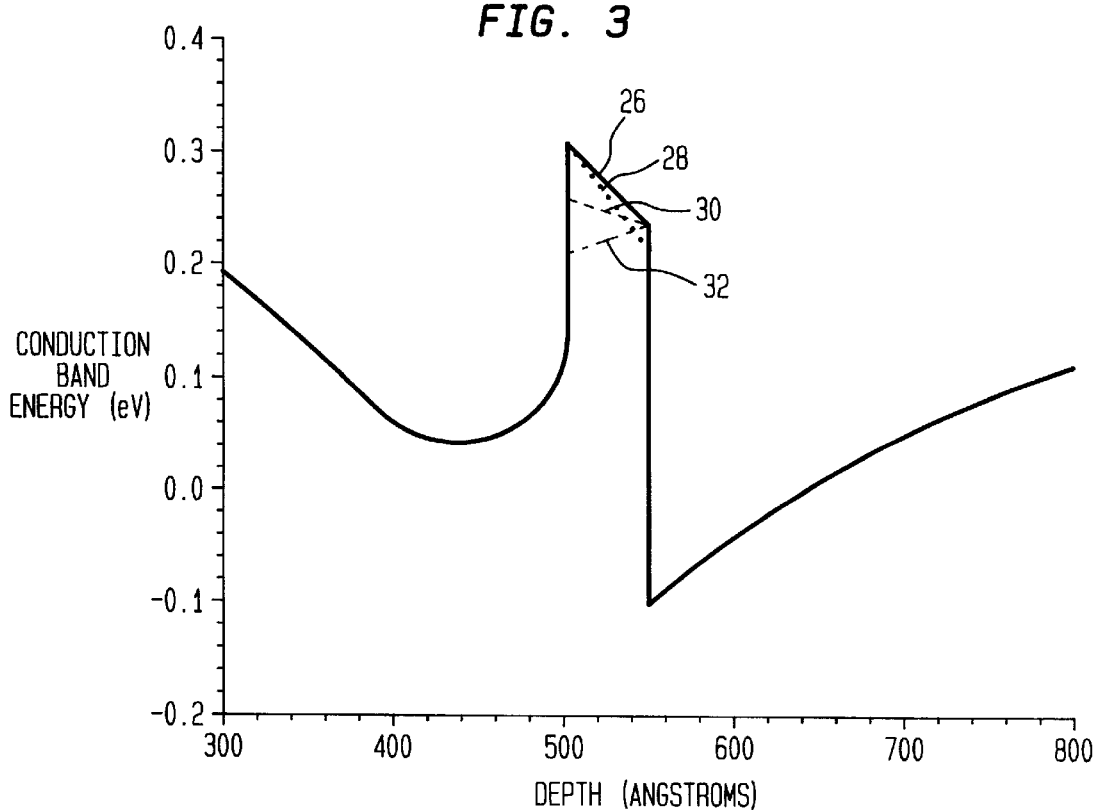
FIG. 3 illustrates typical spacer layer conduction band energy slope variations attained with the FIG. 1 embodiment of the present invention.

As shown in FIGS. 1 and 2, the multiple layer structure of the invention resembles prior art semiconductor heterostructures. The FIG. 1 embodiment of the invention relates to a semiconductor heterostructure for a high electron mobility transistor (HEMT). This heterostructure consists of a semi-insulating GaAs substrate 10, a 1 micron nominally undoped GaAs buffer layer 12, a 50 Å undoped $Al_xGa_{1-x}As$ spacer layer 14 of a graded composition, a 25–50 Å undoped $Al_{0.25}Ga_{0.75}As$ layer 16, an $Al_{0.25}Ga_{0.75}As$ layer 18 which is delta-doped with silicon at a concentration of $3\times10^{12}cm^{-2}$, a 300 Å undoped $Al_{0.25}Ga_{0.75}As$ layer 20 and a 300–100 Å GaAs contact layer 22 silicon-doped at a concentration of $2\times10^{18}cm^{-3}$.

The FIG. 2 embodiment of the invention relates to a semiconductor heterostructure for a pseudomorphic HEMT. This heterostructure consists of a semi-insulating GaAs substrate 36, a one micron nominally undoped GaAs buffer layer 38, an undoped 100–150 Å $In_{0.2}Ga_{0.8}As$ layer 40, a 50 Å undoped $Al_xGa_{1-x}As$ spacer layer 42 of graded composition, a 25–50 Å undoped $Al_{0.25}Ga_{0.75}As$ layer 44, an $Al_{0.25}Ga_{0.75}As$ layer 46 that is delta-doped with silicon at a concentration of $3\times10^{12}cm^{-2}$, a 300 Å undoped $Al_{0.25}Ga_{0.75}As$ layer 48 and a 100–300 Å GaAs contact layer 50 that is silicon-doped at a concentration of $2\times10^{18}cm^{-3}$. The heterostructure can be grown using molecular beam epitaxy (MBE) or metal-organic-chemical vapor deposition (MOCVD) growth techniques. The graded-composition spacer layer design can also be used in symmetrically-doped pseudomorphic HEMTs HEMTs that are based on InP substrates and other modulation-doped heterostructure devices. In general, the spacer layer is graded to have a low mole fraction side and a high mole fraction side. In the heterostructure, the low mole fraction side interfaces with one of the other layers to define one boundary of a quantum well wherein a two dimensional electron gas is confined. Consequently, the conduction band energy thereby decreases across the spacer layer from the high mole fraction side to the low mole fraction side with a negative slope. For symmetrically doped pseudomorphic HEMTs, graded spacer layers may be utilized at both quantum well interfaces.

Figure 4:
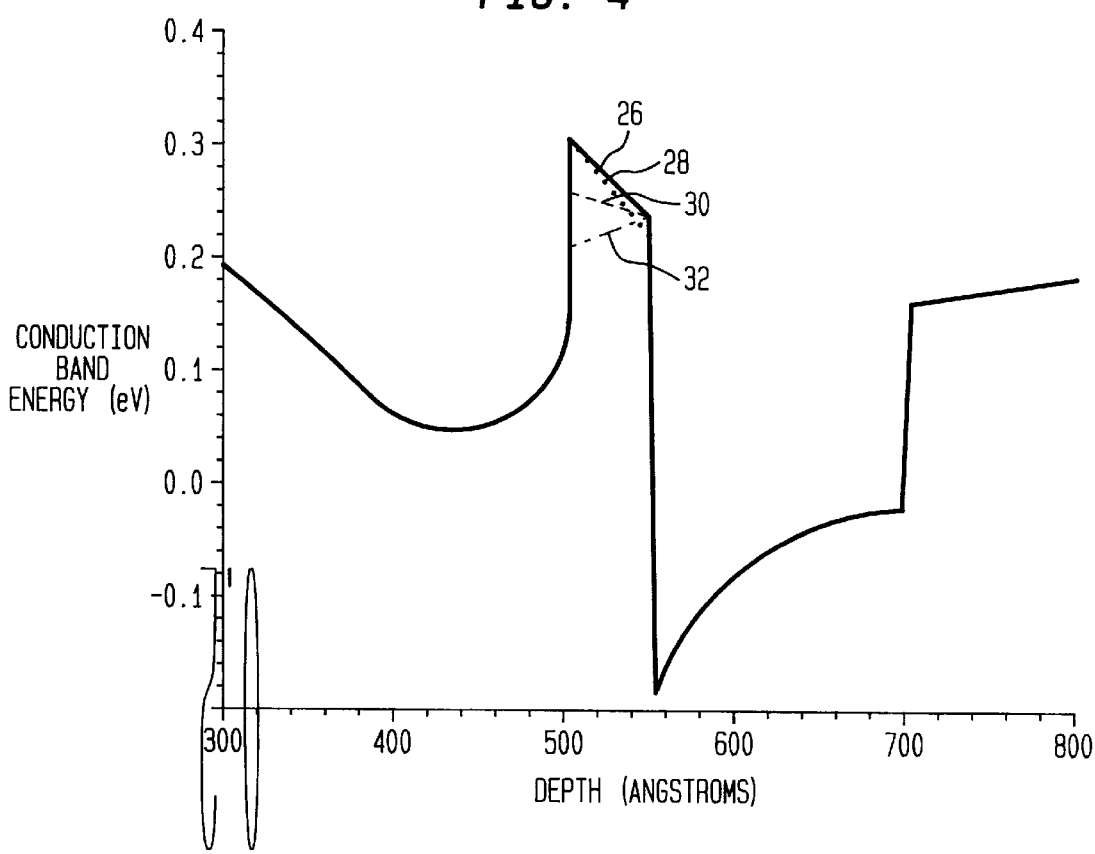
FIG. 4 illustrates typical spacer layer conduction band energy slope variations attained with the FIG. 2 embodiment of the present invention.

Using a self-consistent Poisson-Schrodinger solver, numerical simulations with four different Linearly graded spacer layer compositions were carried out for both AlGaAs/GaAs and pseudomorphic AlGaAs/InGaAs/GaAs HEMT heterostructures. However, the invention could also be applied with nonlinearly graded spacer layer compositions, such as those having a quadratic formulation. The resultant conduction band energies for the AlGaAs/GaAs and AlGaAs/InGaAs/GaAs HEMTs are shown in FIG. 3 and FIG. 4 as a function of depth in Angstroms(Å) from the top surface of the heterostructure. These figures clearly show that the slope of the spacer layer conduction band energy can be readily varied from positive (dashed/dotted line 32) to negative (solid line 26, dotted line 28 and dashed line 30) by grading the AlGaAs composition. In FIGS. 3 and 4, solid line 26 relates to spacer layer composition with a conduction band energy slope which results from a mole fraction X no greater than 0.4 and no less than 0.2, dashed line 30 relates to spacer layer composition with a conduction band energy slope which results from a mole fraction X no greater than 0.36 and no less than 0.2, dashed/dotted line 32 relates to spacer layer composition with a conduction band energy slope which results from a mole fraction X no greater than 0.32 and no less than 0.2, dotted line 28 relates to spacer layer composition with a conduction band energy slope which results from a mole fraction X no greater than 0.4 and no less than 0.18. In FIG. 5 it is shown that the grading difference of the spacer layer compositions shown in FIGS. 3 and 4 has no affect on the 2DEG density and the spatial distribution of electrons.

The heterostructure design of the invention differs from prior art HEMT design by the use of the graded composition $Al_xGa_{1-x}As$ spacer layer. The 1/f low frequency noise reduction concept disclosed herein is based on a reduction of the trap fluctuation factor. However, it can be used in conjunction with other noise reduction techniques which aim at reducing the interface trap density or modifying the 2DEG transport characteristics.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A heterostructure semiconductor of the type wherein a substrate layer is disposed with a plurality of other layers deposited in sequence thereover, the improvement comprising:

a spacer layer of graded composition is located in the heterostructure and includes a low mole fraction side which interfaces with one of the other layers to define one boundary of a quantum well wherein a two dimensional electron gas is confined, the spacer layer also includes a high mole fraction side from which the conduction band energy decreases with a negative slope to the low mole fraction side.

2. The heterostructure semiconductor of claim 1 wherein the spacer layer composition is linearly graded.

3. The heterostructure semiconductor of claim 1 wherein the spacer layer composition is nonlinearly graded.

4. The heterostructure semiconductor of claim 1 wherein the low mole fraction side of the spacer layer interfaces with a layer of GaAs.

5. The heterostructure semiconductor of claim 1 wherein the low mole fraction side of the spacer layer interfaces with a layer of InGaAs.

6. The heterostructure semiconductor of claim 1 wherein an InP substrate layer is included.

7. The heterostructure semiconductor of claim 1 wherein the spacer layer is $Al_xGa_{1-x}As$.

8. The heterostructure semiconductor of claim 7 wherein the low mole fraction side which interfaces with thickness of the spacer layer is 50 to 100 Angstroms.

9. The heterostructure semiconductor of claim 7 wherein the low mole fraction side of the spacer layer interfaces with a layer of GaAs.

10. The heterostructure semiconductor of claim 7 wherein the low mole fraction side of the spacer layer interfaces with a layer of InGaAs.

* * * * *